(12) United States Patent
Robinson et al.

(10) Patent No.: US 7,271,643 B2
(45) Date of Patent: Sep. 18, 2007

(54) CIRCUIT FOR BLOWING AN ELECTRICALLY BLOWABLE FUSE IN SOI TECHNOLOGIES

(75) Inventors: Adrian O. Robinson, Poughkeepsie, NY (US); George E. Smith, III, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 11/138,102

(22) Filed: May 26, 2005

(65) Prior Publication Data
US 2006/0267669 A1    Nov. 30, 2006

(51) Int. Cl.
*H01H 37/76*    (2006.01)
*H01H 85/00*    (2006.01)
(52) U.S. Cl. ....................................... 327/525
(58) Field of Classification Search ................ 327/525, 327/526; 365/225.7
See application file for complete search history.

(56) References Cited

U.S. PATENT DOCUMENTS 3,356,858 A * 12/1967 Wanlass ..................... 326/103
5,407,850 A *  4/1995 Doyle et al. ................ 438/151
6,710,640 B1 *  3/2004 Kothandaraman et al. .. 327/525

* cited by examiner

*Primary Examiner*—Quan Tra
(74) *Attorney, Agent, or Firm*—Lynn L. Augspurger

(57) ABSTRACT

An electrically blowable fuse circuit having a fuse which may be placed in a condition to be blown. The circuit includes a first transistor having a body, a source, a drain, and a gate. The source is connected to one end of the fuse and the drain is connected to ground. The first transistor further includes a controllable parasitic device in its body. A second transistor is connected to the parasitic device such that when the second transistor is turned on, the parasitic device turns on the first transistor, allowing the fuse to be blown when the fuse is placed in a condition to be blown.

10 Claims, 3 Drawing Sheets

CIRCUIT FOR BLOWING AN ELECTRICALLY BLOWABLE FUSE IN SOI TECHNOLOGIES

FIELD OF THE INVENTION

This invention relates to electrically blowable fuses, and more particularly to a circuit for blowing electrically blowable fuses in Silicon-On-Insulator (SOI) technologies.

BACKGROUND OF THE INVENTION

Existing solutions for blowing an electrically blowable fuse (efuse) use large, cascoded transistors to control the current required to blow the fuse.

SUMMARY OF THE INVENTION

The shortcomings of the prior art are overcome and additional advantages are provided through the provision of an electrically blowable fuse which relies on the parasitic devices available on all FETs, but which are controllable only on SOI devices. A simplified circuit results because of drain-body breakdown which is higher that the drain-gate breakdown.

The present invention includes an electrically blowable fuse circuit having a fuse which may be placed in a condition to be blown. The circuit includes a first transistor having a body, a source, a drain, and a gate. The source is connected to one end of the fuse and the drain is connected to ground. The first transistor further includes a controllable parasitic device in its body. A second transistor is connected to the parasitic device such that when the second transistor is turned on, the parasitic device turns on the first transistor, allowing the fuse to be blown when the fuse is placed in a condition to be blown.

Another object of the present invention is to provide an electrically blowable fuse circuit in which the first transistor is a Field-Effect Transistor (FET) Silicon-On-Insulator (SOI) device.

Another object of the present invention is to provide an electrically blowable fuse circuit in which the second transistor is an FET having a source, a drain, and a gate. The drain of the second transistor is connected to a parasitic device in the first transistor, and the gate of the second transistor controllably turns on the parasitic device when the fuse is to be blown.

Another object of the present invention is to provide an electrically blowable fuse circuit in which a voltage source is connected to the other end of the fuse. The voltage source is adjustable to supply a high voltage when said fuse may be blown and to supply a voltage at ground potential when the fuse is not to be blown.

Another object of the present invention is to provide an electrically blowable fuse circuit in which a transmission gate is connected between the gate of the first transistor and ground such that the gate of the first transistor is floating when attempting to blow the fuse, and grounded when not attempting to blow the fuse.

Another object of the present invention is to provide an electrically blowable fuse circuit in which a third transistor is provided having a source, a drain and a gate. The gate of the third transistor is connected to the gate of the second transistor, the source of the third transistor is connected to ground, and the source of the third transistor is connected to the drain of the second transistor and the parasitic device such that the first transistor is discharged when not blowing the fuse.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed ion taken in conjunction with the accompanying drawings in which:

The detailed description explains the preferred embodiments of the invention, with advantages and features, by way of example with reference to the drawings.

DETAILED DESCRIPTION OF THE INVENTION

Figure 1:
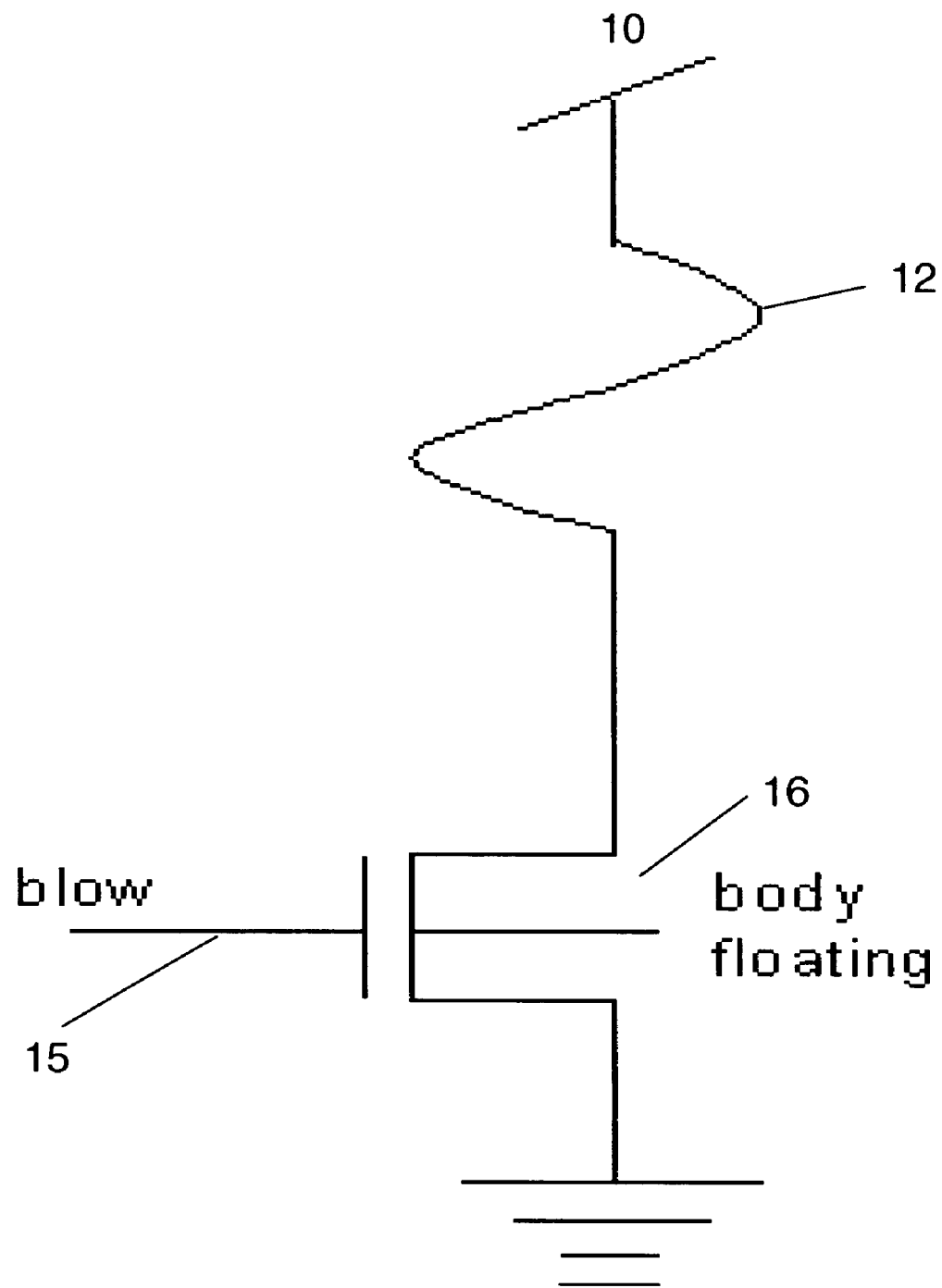
FIG. 1 a schematic diagram of a conventional electrically blowable fuse circuit.

FIG. 1 is a simplified circuit diagram of a conventional circuit in which a power supply 10 connected to top of a fuse 12 is held at ground potential, unless the fuse 12 is to be blown. If the fuse 12 is to be blown, the voltage 19 is raised higher than the standard supply voltage, typically in excess of 2.0 V. This high voltage requires a cascode structure for an n-type Field-Effect Transistor (NFET) 16 that controls the process. In FIG. 1, a single transistor 16 is shown. When the blow line 15 is brought high, the transistor 16 is turned on; a large current (~50 mA for current technologies) flows through the fuse, causing the fuse 12 to blow. It will be understood that in SOI technologies, the body of the transistor 16 is floating, unless special arrangements are made.

Figure 2:
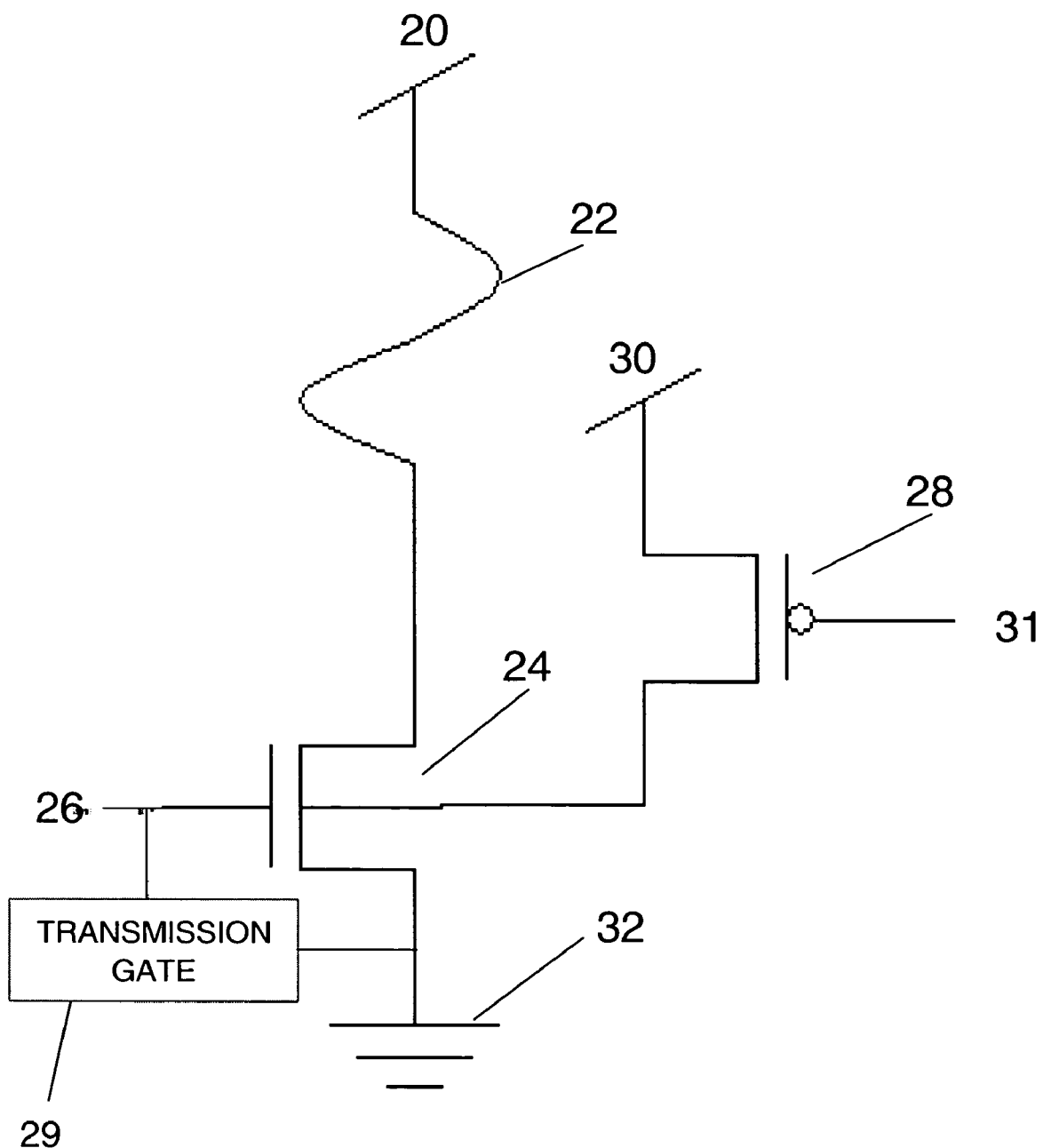
FIG. 2 is one embodiment of the electrically blowable fuse circuit of the present invention.

FIG. 2 is a schematic diagram of a simplified version of the present invention. A voltage 20 is applied to the top of a fuse 22. The voltage 20 is ground when the fuse is not to be blown, and a high voltage when the fuse 22 may be blown. A NFET 24 is an SOI device and is connected to control current through the fuse 22. It will be understood that since NFET 24 is an SOI device, a parasitic device is in the body of the NFET 24 and is controllable. The NFET 24 is not a cascode structure as the high voltage 20 is not applied across the gate oxide. The gate 26 is left floating when the fuse 22 might be blown. A p-type Field-Effect Transistor (PFET) 28 is connected to control the parasitic device in the body of NFET 24, and is a conventional transistor. The power supply 30 connected to the PFET 28 is the standard power supply, not the high voltage 20. When the gate 31 of the PFET 28 is brought low, the PFET 28 turns on and injects charge into the body of the NFET 24, which will turn on the body-source junction of the transistor 24. This causes the parasitic NPN in the body of NFET 24 to turn on, drawing beta*, the body current through the drain, blowing the fuse 22.

Since the gate 26 is floating during fuse blow, an ordinary short channel transistor can be used. No cascode structure is required as the drain-body breakdown is higher than the drain-gate breakdown. A standard short channel transistor will give a high gain to the parasitic device and reduce the area required by the entire structure. The gate 26 of the NFET 24 can be connected through a transmission gate 29 to ground 32 so that the gate 26 is floating when fuse blowing is attempted, and grounded when it is not.

Figure 3:
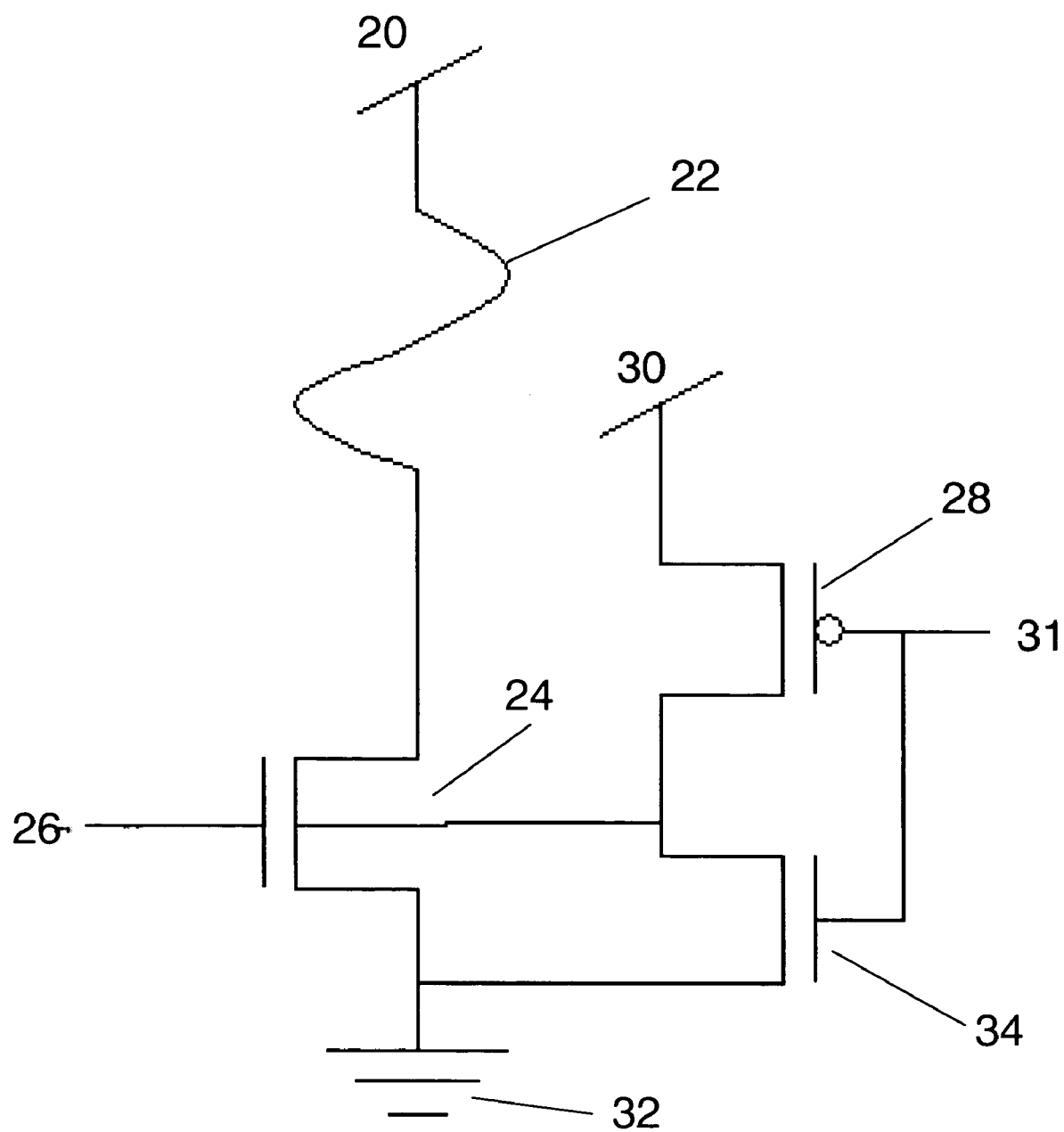
FIG. 3 is another embodiment of the electrically blowable fuse circuit of the present invention.

Another embodiment is shown in FIG. 3 wherein an NFET 34 is added as shown. In the embodiment of FIG. 3, the drain of NFET 34 is connected to the body of NFET 24, the drain of PFET 28 is connected to the drain of NFET 34, and the gate of NFET 34 is connected to the gate of PFET 28, and the source of the NFET 34 is connected to ground 32. The NFET 34 ensures that the body of the NFET 24 is discharged when not blowing the fuse 22.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An electrically blowable fuse circuit comprising:
    a fuse which may be placed in a condition to be blown;
    a first transistor having a body, a source, a drain, and a gate, said drain connected to one end of said fuse and said source connected to ground, said first transistor including a controllable parasitic device in said body;
    a second transistor connected to said parasitic device such that when said second transistor is turned on, said parasitic device turns on said first transistor, allowing said fuse to be blown when said fuse is placed in a condition to be blown; and
    a transmission gate connected between the gate of said first transistor and ground such that the gate of said first transistor is floating when attempting to blow said fuse, and grounded when not attempting to blow said fuse.

2. The electrically blowable fuse circuit according to claim 1 wherein said first transistor is a Silicon-On-Insulator (SOI) Field-Effect Transistor (FET).

3. The electrically blowable fuse circuit according to claim 2 wherein said second transistor is an FET having a source, a drain, and a gate, said drain is connected to said parasitic device in said first transistor, and said gate controllably turns on said parasitic device when said fuse is to be blown.

4. The electrically blowable fuse circuit according to claim 1 further comprising a voltage source connected to the other end of said fuse, said voltage source adjustable to supply a high voltage when said fuse may be blown and to supply a voltage at ground potential when said fuse is not to be blown.

5. The electrically blowable fuse circuit according to claim 3 further comprising a third transistor having a source, a drain and a gate, the gate of said third transistor connected to the gate of said second transistor, the source of said third transistor connected to ground, and the drain of said third transistor connected to the drain of said second transistor and said parasitic device such that the first transistor is discharged when not blowing said fuse.

6. A method for blowing an electrically blowable fuse, said method comprising:
    connecting the source of a first transistor having a body, a source, a drain, a gate, and a controllable parasitic device in said body, to one end of said fuse, and connecting the drain to ground;
    connecting a second transistor to said parasitic device such that when said second transistor is turned on, said parasitic device turns on said first transistor;
    placing a voltage on the other end of said fuse, said voltage being sufficient to blow said fuse when said first transistor is turned on;
    turning on said second transistor; and
    connecting a transmission gate between the gate of said first transistor and ground such that the gate of said first transistor is floating when attempting to blow said fuse, and grounded when not attempting to blow said fuse.

7. The method according to claim 6 wherein said first transistor is a Silicon-On-Insulator (SOI) Field-Effect Transistor (FET).

8. The method according to claim 7 wherein said second transistor is an FET having a source, a drain, and a gate, said method further comprising;
    connecting the drain of said second transistor to said parasitic device in said first transistor; and
    controlling the gate of said second transistor to controllably turn on said parasitic device when said fuse is to be blown.

9. The method according to claim 6 further comprising varying said voltage to ground potential when said fuse is not to be blown.

10. The method according to claim 8 further comprising:
    connecting the gate of a third transistor having a source, a drain and a gate, to the gate of said second transistor;
    connecting the source of said third transistor to ground; and
    connecting the drain of said third transistor to the drain of said second transistor and said parasitic device,
    such that the first transistor is discharged when not blowing said fuse.

* * * * *